U.S. Patent  Jul. 3, 1979  4,159,917
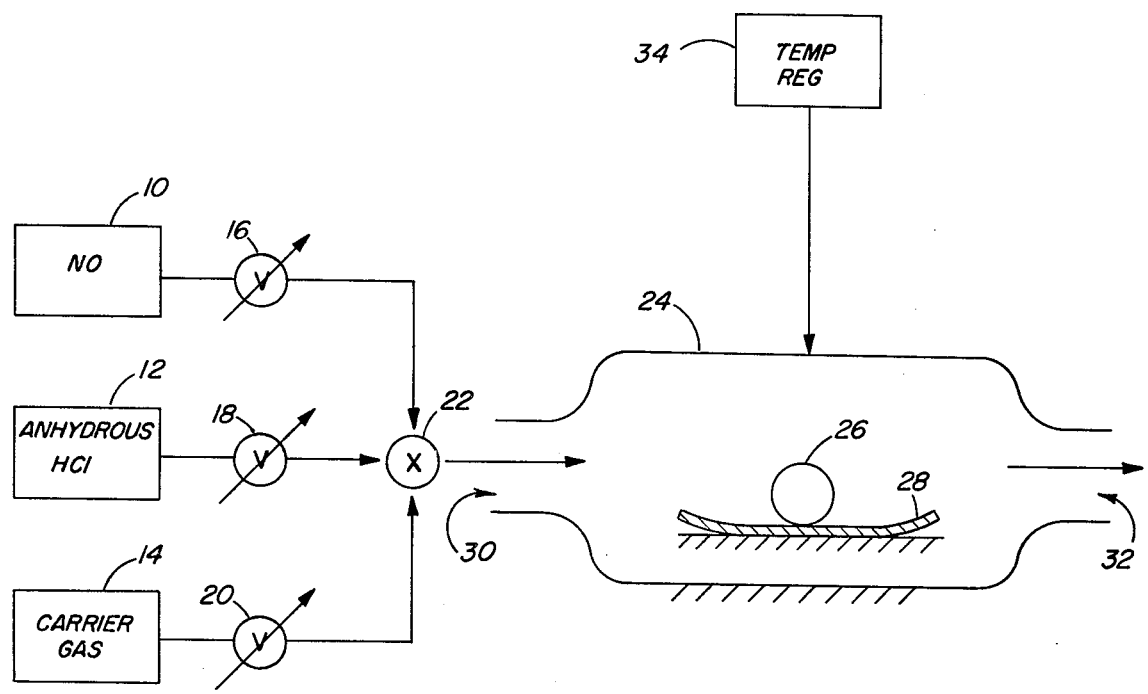

United States Patent [19]

Gluck

[11] 4,159,917
[45] Jul. 3, 1979

[54] METHOD FOR USE IN THE MANUFACTURE OF SEMICONDUCTOR DEVICES

[75] Inventor: Ronald M. Gluck, Rochester, N.Y.

[73] Assignee: Eastman Kodak Company, Rochester, N.Y.

[21] Appl. No.: 801,434

[22] Filed: May 27, 1977

[51] Int. Cl.² .................. H01L 21/302; H01L 7/34
[52] U.S. Cl. .................................. 148/1.5; 134/3; 148/186; 156/646
[58] Field of Search .............. 148/1.5, 186, 187, 191; 156/646; 134/3; 357/52

[56] References Cited

U.S. PATENT DOCUMENTS

| | | | |
|---|---|---|---|
| 3,390,011 | 6/1968 | Brown et al. ................ | 156/646 X |
| 3,518,132 | 6/1970 | Glendinning ................ | 156/646 |
| 3,556,879 | 1/1971 | Mayer ........................ | 148/187 X |
| 3,672,980 | 6/1972 | Glendinning et al. ....... | 357/52 X |
| 3,692,571 | 9/1972 | Colton et al. ............... | 427/93 |
| 3,711,324 | 1/1973 | Glendinning et al. ....... | 357/52 X |
| 3,718,503 | 2/1973 | Glendinning et al. ....... | 148/187 |
| 3,923,569 | 12/1975 | Ono et al. ................... | 156/646 |

OTHER PUBLICATIONS

J. of Electronic Materials, vol. 4, No. 3, 1975, pp. 591-624.

*Primary Examiner*—G. Ozaki
*Attorney, Agent, or Firm*—Robert F. Cody

[57] ABSTRACT

A procedure for cleaning a semiconductor material of impurities which reside on the surface of the material is disclosed. The procedure is indicated for use prior to one or more thermal processing steps for the material, and involves the exposure of the material to a cleaning gas comprised of nitric oxide and, in a presently preferred form, of anhydrous hydrochloric acid as well.

1 Claim, 1 Drawing Figure

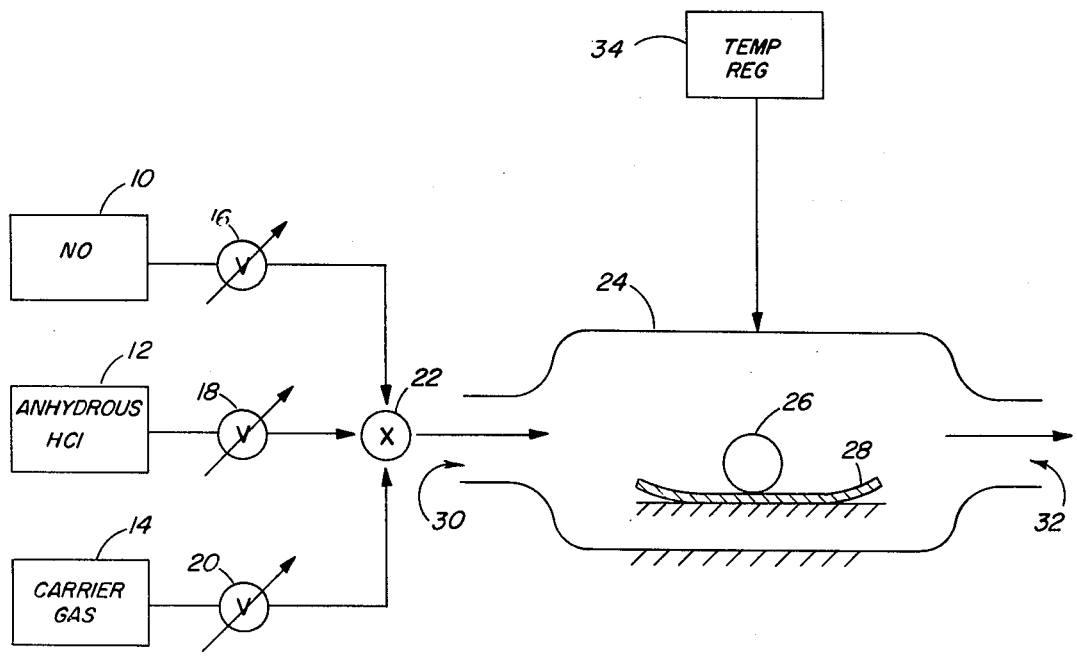

METHOD FOR USE IN THE MANUFACTURE OF SEMICONDUCTOR DEVICES

BACKGROUND OF THE INVENTION

1. Field of the Invention

This invention relates in general to semiconductor devices, and in particular to an improved method for use in manufacturing such devices.

2. Discussion Relative to the Prior Art

The manufacture of semiconductor devices such as silicon integrated circuits and charge coupled devices requires that impurities be kept from residing on the surface of such devices. Impurities such as copper, iron and gold are especially troublesome since they form undesirable charge traps at device surfaces, and can diffuse into the silicon bulk to form hot spots, or noise sources, which adversely affect device performance.

Aside from ab initio attempts to minimize impurity contamination, present practice is to getter impurity atoms at various stages of device manufacture. Conventionally, devices are formed from a silicon wafer which is photolithographically processed through successive steps, many of which involve 1. thermal diffusion of dopants into the silicon, and
2. the thermal growth of an oxide over region(s) of the silicon.

Before each thermal step (which takes place in a gaseous environment within a high-temperature oven), it is customary to clean the silicon wafer. Typically, this is done by immersing the wafer in a dilute solution of ammonium hydroxide and hydrogen peroxide for 20 minutes at 80° C.; rinsing the wafer with distilled water; immersing the wafer in a solution of hydrogen peroxide and hydrochloric acid for 20 minutes at 80° C.; and again rinsing the wafer with distilled water. Such a technique, while working to clean away trace amounts of, impurities leaves something to be desired, primarily because it requires handling and processing by wet solutions; and because it takes a fair amount of time to do. (A wafer, before processing, usually has impurity levels lower than after such processing, despite the use of cleaning procedures. For example, an unprocessed wafer may have a gold impurity level of $10^{11}$ atoms/cc of silicon; after processing — with cleaning — the gold impurity level might rise, say, to $6 \times 10^{12}$ atoms/cc of silicon.)

SUMMARY OF THE INVENTION

The invention provides for the gaseous cleaning of semiconductor materials:

In a presently preferred form of the invention, a mixture of gases is employed to clean, say, a silicon wafer. Although a particular gas — nitric oxide — of the gas mixture has been found to be alone effective to clean away metallic impurities from the wafer (i.e., 99.85% of copper was removed from a wafer in ten minutes of exposure to nitric oxide at 1000° C.), nitric oxide when combined with a second gas — anhydrous hydrochloric acid — can efficiently clean even gold from the wafer... it being interesting to note that, in general, neither nitric oxide nor anhydrous hydrochloric acid are singularly effective for cleaning away gold.

Gaseous cleaning may be performed at selected steps of wafer-processing. From the standpoint of how long it takes to effect good cleaning, gaseous cleaning according to the invention permits cleaning to be done generally in less than about five minutes: In a typical implementation of the invention, a mixture of nitric oxide, anhydrous hydrochloric acid, and a carrier gas of nitrogen, at 900° C., and respective flow rates of 112.5 cc/min, 135 cc/min, and 2250 cc/min, was for two minutes used effectively to clean a silicon wafer of impurities; and, with respect to hard-to-clean gold, about 60% was removed.

An interesting aspect of the invention is that, by suitably choosing operating conditions, the tendency to form an undesirable nitride or oxynitride coating on silicon may be limited. For example, for a cleaning cycle preparatory to a thermal oxidation step, it would be desirable to avoid formation of a nitride/oxynitride film on the silicon. Given a percent inhibition probability I, against forming an oxide film during a subsequent oxidation procedure, defined as:

I = oxide thickness without gettering minus oxide thickness with gettering/oxide thickness without gettering × 100 the percent inhibition probability of the above-noted typical implementation of the invention is −0.3%, evidencing an enhanced oxidation rate. Of course, in some instances there is little or no concern for nitride or oxynitride forming during cleaning. In such cases, the operating conditions may be chosen to optimize, say, gettering of gold: By doubling the flow rate for nitric oxide in the above-noted typical implementation, the gettering of gold increases to 70.5%... although the oxidation inhibition probability I increases to +36.1%. (Indeed, at 1000° C., and at anhydrous hydrochloric acid, nitric acid, and nitrogen flow rates of, respectively, 67.5, 112.5 and 2250 cc/min, 88.6% of impurity gold on a sample was removed.)

The invention will be further described with reference to the FIGURE which shows schematically one implementation of the invention.

Referring to the sole FIGURE, a system for practicing the invention employs a source 10 of nitric oxide, a source 12 of anhydrous hydrochloric acid, and a source 14 of carrier gas such as nitrogen, argon, etc. Adjustable valves 16, 18 and 20, respectively, regulate the flow of nitric oxide, anhydrous hydrochloric acid and carrier gas into a mixing chamber 22 connected to a furnace tube 24 of a conventional type. Silicon wafers 26 are stacked in a boat 28 within the furnace, the mixed gases flowing into and out of furnace ports 30 and 32. The furnace temperature is regulatable by means of a temperature regulator 34. As is known, furnace temperatures used in the silicon semiconductor industry are typically between 850° C. and 1100° C. Gettering is a relatively complex phenomenon resulting from the interplay of many influences. Although some sets of parameters for the gettering operation work better than others, the chart below shows some parameter sets which are especially attractive, or representative. In the right-hand column of the chart, the percentage of gold removal is indicated, gold being so indicated because it is perhaps the most difficult of impurities to getter.

| Flow Rates (cc/min) | | | Temp. | Time | % Gold |
| --- | --- | --- | --- | --- | --- |
| NO | HCl | N₂ | 20° C | (min) | Gettered |
| 67.5 | 67.5 | 2250 | 900 | 2 | 57.5 |
| 135 | 135 | 2250 | 900 | 5 | 67.4 |
| 225 | 67.5 | 2250 | 900 | 2 | 62.8 |
| 225 | 135 | 250 | 900 | 5 | 70.5 |
| 225 | 270 | 2250 | 900 | 5 | 69.9 |
| 112.5 | 67.5 | 2250 | 1000 | 5 | 88.6 |
| 225 | 67.5 | 2250 | 1000 | 1 | 65.0 |

-continued

| Flow Rates (cc/min) | | | Temp. | Time | % Gold |
| --- | --- | --- | --- | --- | --- |
| NO | HCl | $N_2$ | 20° C | (min) | Gettered |
| 135 | 135 | 2250 | 1000 | 1 | 62.9 |
| 225 | 135 | 2250 | 1000 | 3 | 65.9 |

The invention has been described in detail with particular reference to certain preferred embodiments thereof, but it will be understood that variations and modifications can be effected within the spirit and scope of the invention. For example, practice of the invention may be to complement — not replace — one or more wet cleaning steps used in the cleaning of a silicon wafer. That is, having conventionally cleaned a wafer, it is within the purview of the invention to subject the wafer to nitric oxide and anhydrous hydrochloric acid as indicated in one of the examples depicted in the above chart.

What is claimed is:

1. In a method for the manufacture of a silicon semiconductor device, said method comprising at least one step in which such device is exposed to a high-temperature gaseous environment, the improvement of gettering metallic gold and other impurities from the silicon of said device comprising the step of exposing said device for a period of less than ten minutes, prior to said exposure to said gaseous environment, to an anhydrous cleaning gas mixture containing nitric oxide and hydrogen chloride together with a carrier gas of molecular nitrogen, said cleaning gas mixture being in the temperature range of 850° C. to 1100° C., and being comprised of a gas mixture of at least four parts of molecular nitrogen to one part of the combination of nitric oxide and hydrogen chloride.

* * * * *